US012606708B2

(12) United States Patent (10) Patent No.: US 12,606,708 B2
Scherer et al. (45) Date of Patent: Apr. 21, 2026

(54) PRODUCTION OF PIGMENTS HAVING A DEFINED SIZE AND SHAPE

(71) Applicant: GIESECKE+DEVRIENT CURRENCY TECHNOLOGY GMBH, Munich (DE)

(72) Inventors: Maik Rudolf Johann Scherer, Grainau (DE); Kai Herrmann Scherer, Munich (DE)

(73) Assignee: GIESECKE+DEVRIENT CURRENCY TECHNOLOGY GMBH, Munich (DE)

( * ) Notice: Subject to any disclaimer, the term of this patent is extended or adjusted under 35 U.S.C. 154(b) by 225 days.

(21) Appl. No.: 18/032,374

(22) PCT Filed: Oct. 14, 2021

(86) PCT No.: PCT/EP2021/025403
§ 371 (c)(1),
(2) Date: Apr. 18, 2023

(87) PCT Pub. No.: WO2022/083889
PCT Pub. Date: Apr. 28, 2022

(65) Prior Publication Data
US 2024/0026159 A1 Jan. 25, 2024

(30) Foreign Application Priority Data
Oct. 20, 2020 (DE) ..................... 10 2020 006 455.8

(51) Int. Cl.
*C09C 1/00* (2006.01)
*B81C 1/00* (2006.01)
(Continued)

(52) U.S. Cl.
CPC ........ *C09C 1/0015* (2013.01); *B81C 1/00349* (2013.01); *B82B 3/0038* (2013.01); *B29C 2059/023* (2013.01); *C09C 2200/409* (2013.01)

(58) Field of Classification Search
CPC ........... C09C 1/0015; C09C 2200/409; C09C 2200/40; B81C 1/00349; B81C 1/0038; B29C 2059/023
(Continued)

(56) References Cited

U.S. PATENT DOCUMENTS

| 2003/0099737 A1* | 5/2003 | Eldridge | ................ H01R 12/52 |
| | | | 257/E21.582 |
| 2007/0264481 A1* | 11/2007 | DeSimone | ........... A61K 9/5138 |
| | | | 977/773 |

(Continued)

FOREIGN PATENT DOCUMENTS

| EP | 2021401 A2 | 2/2009 |
| EP | 2039729 A2 | 3/2009 |

(Continued)

OTHER PUBLICATIONS

Hawkeye, M., et al., "Glancing Angle Deposition: Fabrication, Properties, and Applications of Micro- and Nanostructured Thin Films", Journal of Vacuum Science and Technology A, 25, pp. 1317-1335; Jul. 30, 2007. (Year: 2007).*
International Search Report from corresponding PCT Application No. PCT/EP2021/025403, Feb. 7, 2022.
German Search Report from corresponding German Application No. 102020006455.8, May 25, 2021.

*Primary Examiner* — Abbas Rashid
*Assistant Examiner* — Gregory C. Grosso
(74) *Attorney, Agent, or Firm* — Workman Nydegger

(57) ABSTRACT
A method is provided for manufacturing pigments of defined size and shape, and to pigments manufactured accordingly. The method has the steps of: a) producing a three-dimensional surface structure on a substrate, where surface regions are formed each having a gradient extending obliquely to a
(Continued)

base level of the surface structure, and are arranged in columns which are offset relative to one another; b) applying a pigment material layer on the surface structure; c) releasing the pigment material layer from the surface structure and producing pigments.

14 Claims, 5 Drawing Sheets

(51) Int. Cl.
  *B82B 3/00* (2006.01)
  *B29C 59/02* (2006.01)
(58) Field of Classification Search
  USPC ......................................................... 264/140
  See application file for complete search history.

(56) References Cited

U.S. PATENT DOCUMENTS

2009/0286665 A1    11/2009   Szuscik-Machnicki et al.
2012/0196084 A1*    8/2012   Ohsawa ................ B29C 59/022
                                                             264/293

FOREIGN PATENT DOCUMENTS

EP          2062947  A1      5/2009
EP          2316892  A2 *   5/2011   .......... C09C 1/0015
WO       2007105001  A2      9/2007

* cited by examiner

S1 — Producing a Three-Dimensional Surface Structure on a Substrate

S2 — Applying a Pigment Material Layer on the Surface Structure

S3 — Separating the Pigment Material Layer from the Surface Structure

PRODUCTION OF PIGMENTS HAVING A DEFINED SIZE AND SHAPE

BACKGROUND

The invention relates to a method for manufacturing pigments of defined size and shape, and to pigments manufactured accordingly.

Manufacturing methods for producing pigments or particles are known from EP2039729 A2, EP2062947 A1, and EP2021401 A2. In these methods, predetermined break points in a layer from which the pigments or particles are produced are provided by disposing so-called walls in a matrix on which the layer is applied. According to EP2316892 A2, predetermined break points in a layer from which the pigments or particles are produced can be produced by a height offset of adjacent plane-parallel structures in a matrix.

Methods for producing matrices for the manufacture of pigments can lead to surface defects of the matrix and therefore to surface defects of the pigments produced therewith. For example, air bubbles develop in the embossing material in embossing methods for producing matrices. The consequence of this, in the case of matrices having plane-parallel, height-offset embossing structures intended for the manufacture of pigments, is that the air bubbles collect in the regions of the embossing structure that are used to produce the optically active regions of the pigments. This leads to surface defects of the pigments and to impairment of the optical quality of the pigments. Furthermore, in the embossing of plane-parallel structures, a maximum amount of the embossing material must be displaced. FIG. 1 shows schematically a cross section through a plane-parallel embossing structure. Air bubbles L collect during embossing at the plane-parallel planes; the arrows P illustrate a flow of material during embossing. The flow of material during embossing of plane-parallel structures takes place in opposite directions. As a result of the displacement of a large amount of material, as is necessary for plane-parallel embossing structures, the quality of the embossing may be impaired. On demolding, moreover, there may be instances of varnish adhesion.

SUMMARY

The intention is therefore to provide a manufacturing method for pigments of high quality.

One embodiment relates to a method for manufacturing pigments of defined size and shape, with the steps of: a) producing a three-dimensional surface structure on a substrate, where surface regions are formed each having a gradient extending obliquely to a base level of the surface structure and are arranged in columns offset relative to one another; b) applying a pigment material layer on the surface structure; c) separating the pigment material layer from the surface structure and producing pigments.

Since at least partly a multiplicity of surface regions are formed with the method on the substrate, these regions each having in parts a gradient which extends obliquely to a base level of the surface structure, plane-parallel surfaces of the surface structure are avoided. For example, at least some of the surface regions each possess an area, more particularly a planar area, which has the gradient and extends obliquely to the base level of the surface structure. Adverse accumulation of air bubbles or of other surface defects in the surface structure is avoided, particularly when an embossing method is employed in step a). Any air bubbles/surface defects that may form do collect at the highest or at the lowest point of the surface regions. Resultant surface defects of the pigments produced with the surface structure develop at the edges of the pigments and have little or no influence on the optical or functional properties of the pigments.

Additionally, the amount of embossing material to be displaced is small if the three-dimensional surface structure in step a) is produced with an embossing method. During embossing, the material to be displaced needs only be transported within one surface region. This significantly facilitates the embossing operation from a technical standpoint and raises the quality of the surface structure and hence of the pigments produced in the further course of the method.

The gradient of the surface regions and also the arrangement of the surface regions in columns offset relative to one another lead, moreover, to a height offset. In this way, predetermined break points are provided for the production of the pigments in the pigment material layer applied on the surface structure. The quality of the pigments produced using the surface structure is enhanced accordingly.

The gradient of at least some of the surface regions may be configured starting from the base level of the surface structure. Hence the base level of the surface structure may also dictate the base level of the surface regions. Additionally, the gradient of at least some of the surface regions may in each case define an identical gradient vector. In this way, the gradient of the relevant surface regions can extend each in the same direction and the surface regions can possess the same spatial orientation. Moreover, the gradient of at least some of the surface regions may be configured in such a way as to extend to a top level of the surface structure. Hence a top level or different top levels of the surface structure may also dictate top levels of the surface regions. In this case the respective top level of the surface regions may be configured so as to be adjacent to the base level of a bordering surface region of the same column. In this way, elevations of the surface regions at the height of the top level may be configured in the columns and in alternation with depressions of the surface regions at the height of the base level. For example, at least some of the surface regions, in each case starting from the base level, possess a surface, more particularly a substantially planar surface, which ascends with the gradient obliquely to the base level to a top level of the surface structure, and that surface, starting from the top level, is joined to the base level of the surface region bordering in the same column by a steep descending surface, more particularly a substantially planar surface, which descends to the base level, e.g. by being perpendicular to the base level. The aforesaid measures support the formation of regular, quasiperiodic or random pigment shapes.

The gradient vectors of at least some of the surface regions may be arranged offset from one another and/or parallel to one another. As a result, a regular pattern of the surface regions and/or a desired height offset between the surface regions can be produced.

At least some of the columns may be arranged in parallel to one another and/or arranged in one direction and/or define a column vector. Through these measures as well it is possible to produce a regular pattern of the surface regions. At the same time the number of surface regions per unit area of the surface structure is optimized.

At least some of the surface regions may be configured in such a way that the projection of the respective gradient vector onto the base level extends parallel to the column vector. This reinforces the regularity of the arrangement of the surface regions. In addition, the number of surface regions per unit area of the surface structure is optimized.

Measures for configuring a regular arrangement and/or a regular pattern of the surface regions may increase the yield of substantially uniform pigments. Moreover, a well-defined, narrow size distribution of the pigments can be obtained, as a result of which it may be possible to dispense with grinding the pigments after the pigment material layer has been detached from the surface structure.

At least some of the surface regions may be configured each with an absolute height difference of 0.1 μm to 150 μm, preferably 0.5 μm to 20 μm, more preferably 1 μm to 10 μm. This height difference enables the manufacture of pigments of the same kind with diverse size ranges and also promotes the production of a well-defined, narrow size distribution of the pigments.

At least for some of the surface regions, between adjacent surface regions of the same column, the average height difference may be twice as great as the average height difference between surface regions of adjacent columns. In this way a height offset is provided which promotes the disintegration of the pigment material layer into individual pigments.

At least some of the surface regions may be provided with the same size and/or same shape. This promotes the production of a well-defined, narrow size distribution of the pigments. The provision of surface regions of identical shape leads to a high yield of substantially uniform pigments.

At least some of the surface regions may be configured, in plan view onto the surface structure, with a contour selected from a polygonal contour, a mutually complementary contour, and a free-form contour. For example, the surface regions each possess an area which extends obliquely to the base level of the surface structure and which has a polygonal contour or a contour of an Escher motif. This promotes the shape diversity of the pigments which can be manufactured.

Furthermore, at least some of the surface regions may be provided with one or more marks, by embossing, for example. On the basis of their profile height and/or shaping, these marks do not lead to predetermined break points in the pigment material layer. Marks of the surface regions in the form of Escher motifs may be employed, for example, as the basis for corresponding marking of the pigments, on areas of the surface regions, for example. The surface regions may additionally be provided with marks for the generation, for example, of holograms, nanostructures and/or micromirrors for optical effects.

At least some of the surface regions of each column, in the cross section of the surface structure in the direction of the column vector, may be configured as a sawtooth pattern. This promotes the development of a height offset between surface regions within each column, with this height offset being used to provide predetermined breaking points for the pigments in the pigment material layer produced on the surface structure.

At least some of the columns may be arranged with an offset to one another by half a side length of a surface region. This makes it possible to produce an optimum height offset between the surface regions between adjacent columns.

In step a), embodiments of the method of the three-dimensional surface structure may be produced on the substrate at least partly by an embossing method. For example, an embossing layer may be applied to the substrate, this layer being embossed. Alternatively, the surface of the substrate may be embossed or the substrate may be cast with the three-dimensional surface structure. The embossing method may be done, for example, by a roll-to-roll process. The substrate may for example be a carrier foil, made for example of PET (polyethylene terephthalate), PE (polyethylene), PC (polycarbonate), PVC (polyvinyl chloride), PMMA (polymethyl methacrylate), or a combination thereof. The substrate may alternatively be formed of a rigid material, such as quartz or glass, for example.

In step a) of the method, the three-dimensional surface structure may be produced by a method selected from: a1) an embossing method with the steps of: applying a soluble, more particularly water-soluble, embossing layer as release layer to the substrate and performing a lithographic, more particularly photolithographic, operation, hot stamping or UV embossing; and/or a2) an embossing method with the steps of: providing a substrate deformable by hot stamping, or applying an insoluble embossing layer to the substrate, performing hot stamping or UV embossing; and applying a soluble, more particularly water-soluble, release layer. With the aforesaid methods it is possible to realize the advantages of the method of embodiments in a particularly extensive way. In steps a1) and/or a2), furthermore, it is possible to emboss marks, for the purpose, for example, of producing flat holograms, nanostructures and/or micromirrors on the pigments for optical effects.

In step a1) it is possible to employ lithographic operations by means of exposing and developing, in which release varnish applied as a release layer is utilized simultaneously as a photolithographic resist. The UV embossing may additionally be performed by irradiating the release layer with UV light, with the release layer comprising or being formed of a soluble embossing varnish which is curable in the UV frequency range.

In step a2) the release layer may be applied with a layer thickness of 50 to 7000 nm, preferably of 100 to 3000 nm. Additionally, the release layer may be applied as a layer which is substantially conformant with the three-dimensional surface structure, in particular having a substantially constant layer thickness. The embossing layer may comprise or be formed of an insoluble hot stamping varnish or UV varnish. Where step a2) is employed, the substrate provided with the embossing layer can be used again.

In step b) of the method of embodiments, a pigment material layer comprising one or more inorganic materials and/or one or more organic materials may be applied on the surface structure. In step b), for example, a pigment material layer may be applied by vapor deposition (physical vapor deposition PVD, chemical vapor deposition CVD) or other coating methods. The pigment material layer may additionally be applied in a roll-to-roll operation. The pigment material layer may be configured as a single layer or as a multiple layer composed of identical or different materials. The pigment material layer may be a metallization or comprise a metallization. Examples of materials which can be used for the pigment material layer, individually or in any desired combination in one or more layers, are: a color flop effect material (colorshift (CS) material, thin-film interference coating), a phase change material; a magnetic material; one or more identical or different materials selected from a metal, an alloy, a dielectric, an oxide, a sulfide, and a fluoride. For example, a color flop effect material may be used in the form of or with a phase change material, or a magnetic color flop effect material can be used. The pigment material layer, furthermore, may also comprise one or more organic layers, applied for example by means of PVD, CVD, printing or spraying.

In step c) of the method, the separating may take place by: mechanical detachment, by means for example of a scraper, the use of an embossed or metal transfer, the use of a release layer and/or a template layer, and dissolution thereof. The separating may take place, for example, in a roll-to-roll process. On detachment, the pigment material layer may disintegrate into fragments. As a result, the pigments can be produced directly in the desired size and shape and expensive milling of the pigments can be avoided. Alternatively or additionally, the detached pigment material layer or fragments thereof and/or the pigments may be grinded. The milling parameters are chosen in such a way that the pigment material layer breaks apart along the predetermined breaking points provided. The pigments may be surface-treated and/or the pigments may be dried. For example, by dissolution of a release layer which is applied beneath the pigment material layer in the course of the method, the pigment material layer may be detached from the surface structure with a solvent, more particularly water. In this case the layers in question may be more particularly the release layers produced by the aforesaid steps a1) and a2).

A further embodiment provides pigments produced by a method as claimed in any of the preceding claims.

Another embodiment relates to use of pigments of the aforesaid embodiment in a printing ink.

BRIEF DESCRIPTION OF THE DRAWINGS

The invention is explained in more detail below by means of exemplary embodiments with reference to the appended drawings, which likewise disclose features essential to the invention. These exemplary embodiments serve merely for illustration and should not be interpreted as imposing limitations. For example, a description of an exemplary embodiment with a multiplicity of elements or components should not be interpreted to mean that all of these elements or components are necessary for implementation. Instead, other exemplary embodiments may also comprise alternative elements and components, fewer elements or components, or additional elements or components. Elements or components of different exemplary embodiments may be combined with one another, unless the contrary is indicated. Modifications and derivations which are described for one of the exemplary embodiments may also be applicable to other exemplary embodiments. In order to avoid repetition, identical or mutually corresponding elements in different figures are given the same reference symbols and not explained again. In the Figures:

FIG. 2b shows schematically the surface structure of FIG. 2a and also a cross-sectional view through the surface structure of FIG. 2a;

DETAILED DESCRIPTION OF VARIOUS EMBODIMENTS

In the text below, with regard to the description of value ranges, the statement of a broad range with narrower alternative or preferred ranges also constitutes disclosure of ranges which may be formed by any desired combination of stated lower range limits with stated upper range limits. The term "gradient extending obliquely to a base level of the surface structure" and modifications thereof may presently denote that the gradient relative to a plane of the base level is 0.01 to 1, preferably from 0.02 to 0.75, more preferably from 0.05 to 0.5. For example, for the production of platelet-shaped pigments having a thickness of 1 μm and a lateral dimension of 30 μm, a gradient of 0.1 is chosen. The term "surface descending steeply to the base level" and modifications thereof may presently denote that the surface extends approximately perpendicular to the base level, in a range, for example, with a deviation from the perpendicular of +/−10°, preferably +/−5°, more preferably +/−2°.

Figure 5:
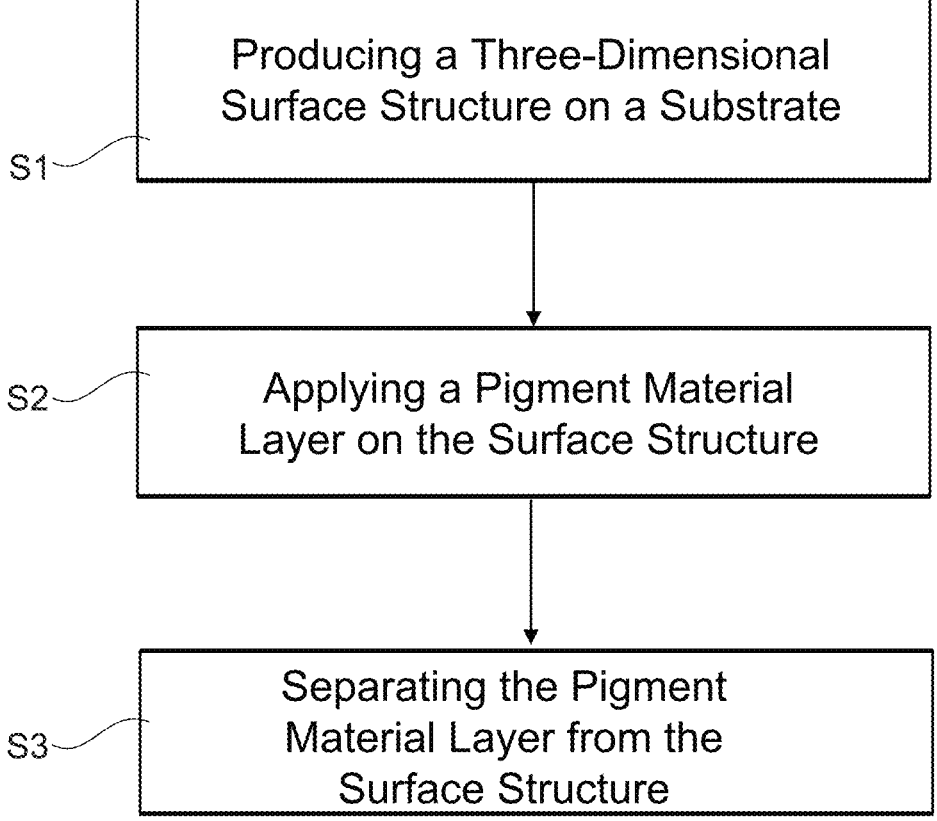
FIG. 5 shows schematically a flow diagram of embodiments of the method.

In a first embodiment, a three-dimensional surface structure is produced by an embossing method, in step a) of the method, this corresponding to step S1 in the flow diagram of FIG. 5. For this purpose a carrier foil of PET (polyethylene terephthalate) is provided as the substrate. An embossing layer 13 composed of a soluble embossing varnish is applied to the surface of the carrier foil, and also acts as a release layer.

A water-soluble embossing layer composed, for example, of polyvinylpyrrolidone (PVP), modified starch, polyacrylic acid, polyethylene glycol, hydroxypropylcellulose, hydroxyethylcellulose, casein, gum arabic, carboxymethylcellulose, polyvinyl alcohol (PVOH), dextrin, or a mixture of two or more of the aforesaid substances, is produced as a thermoplastic hot stamping varnish on the carrier foil in a roll-to-roll process. The present example uses PVOH. The water-soluble embossing layer may be printed on with a layer thickness of 500 nm to 20 μm. The release layer may be applied by means of gravure printing, flexographic printing, slot die or spray nozzle, for example. Alternative thermoplastic hot stamping varnishes may be selected, for example, from PMMA, PVA, PS, which are soluble in solvents other than water. Thereafter, in a roll-to-roll process, by hot stamping of the embossing varnish, a surface structure 10 is produced that has substantially uniform surface regions 12, which in plan view form a pattern with square units. The embossing varnish in this case may be only partly embossed. Alternatively a thermoplastically deformable carrier foil may also be hot-stamped.

Figure 1:
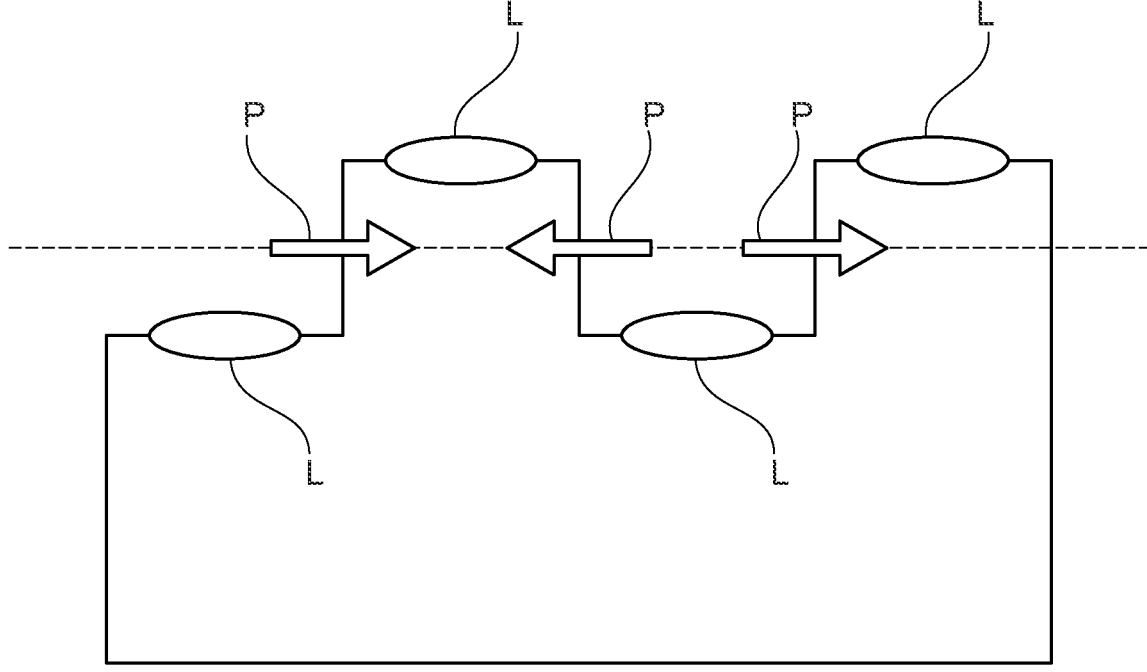
FIG. 1 shows schematically a cross section through a plane-parallel embossing structure of the prior art.
Figure 2A:
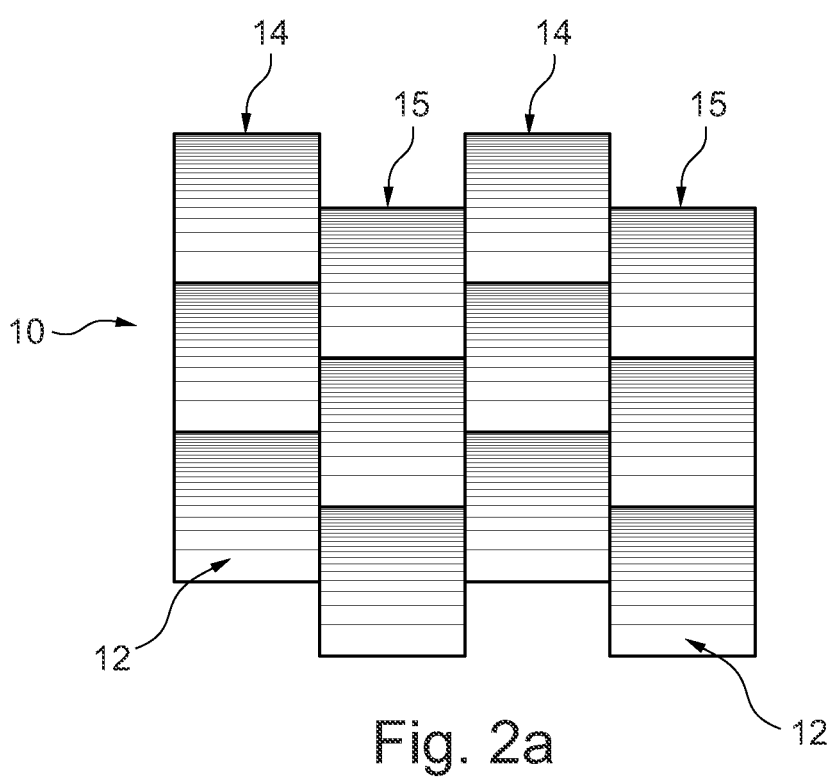
FIG. 2a shows schematically a surface structure of a first embodiment in plan view.

FIG. 2a represents the surface structure 10 produced, schematically in plan view. The surface regions 12 are arranged in columns 14 and 15 which are offset relative to one another. In the present example, the columns 14 and 15 are arranged with an offset relative to one another by half a side length of a surface region 12. The columns 14 and 15 define a column vector in a direction illustrated by the arrow D.

Figure 2B:
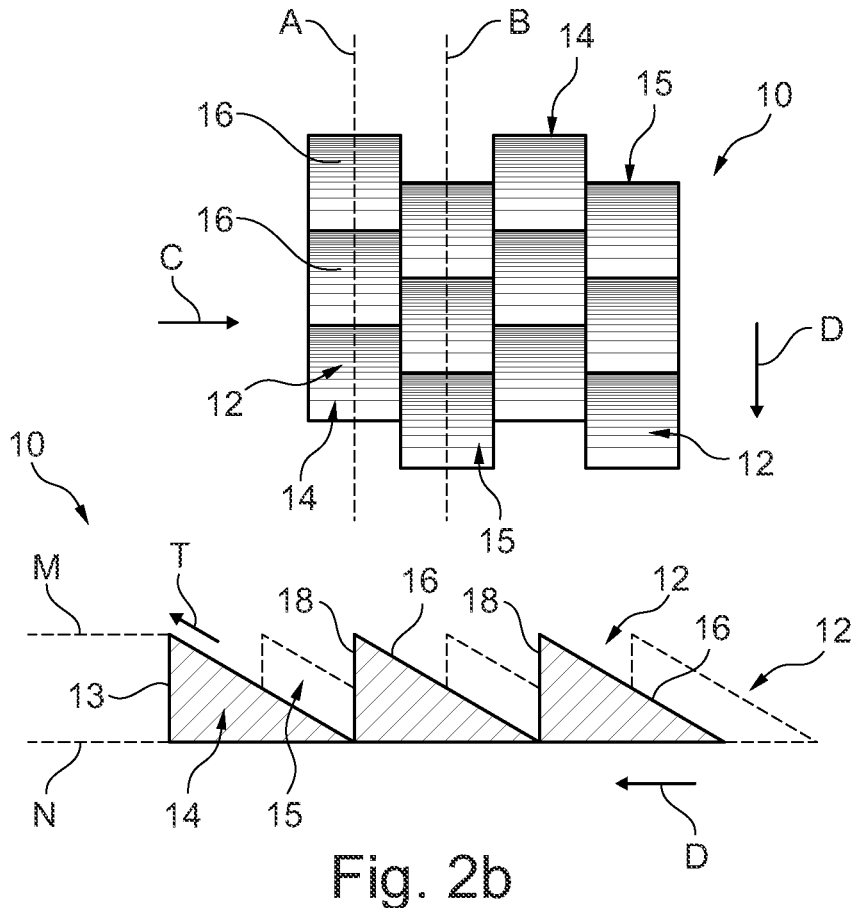

FIG. 2b shows schematically the surface structure 10 of FIG. 2a and also a cross-sectional view along a plane A through one of the columns 14 of the surface structure 10. The surface regions 12 are provided in the embossing layer 13. The arrow C represents the viewing direction of the cross section along the plane A, which is represented by the solid line in the cross-sectional view. A cross section along the plane B represents the outline of the column 15, and is represented by the dashed line in the cross-sectional view and is recognizable behind the column 14 in viewing direction C onto the cross section of the plane A. In the present exemplary embodiment, the columns 14 and 15 each exhibit a sawtooth pattern in cross section.

As is evident from FIG. 2b, the surface regions 12 formed in the embossing layer 13 each possess a square planar surface 16 which has a gradient m=0.5 extending obliquely to a base level N of the surface structure 10. Starting from the base level N, the gradient of each surface 16 extends in a direction which is represented by the arrow T, and defines an identical gradient vector in direction T for each surface region 12. In the present exemplary embodiment, the projection of the gradient vector onto the base level N extends parallel to the column vector D.

FIG. 2b shows further that in this example the surface 16 of the surface regions 12 extends with the gradient m, starting from the base level N, to a top level M of the surface structure 10. In the present example the top level M in each surface region 12 is joined to the base level N of the surface region 12 following in the same column by a planar surface 18 which is substantially perpendicular to the base level N. In this way, in the columns 14 and 15, elevations of the surface regions 12 at the height of the top level M are configured in alternation with depressions of the surface regions 12 at the height of the base level N. In the present example the height difference between successive surface regions 12 in a column 14, 15 is 5 μm, while the height difference between surface regions 12 of adjacent columns 14, 15 is 2.5 μm.

Figure 2C:
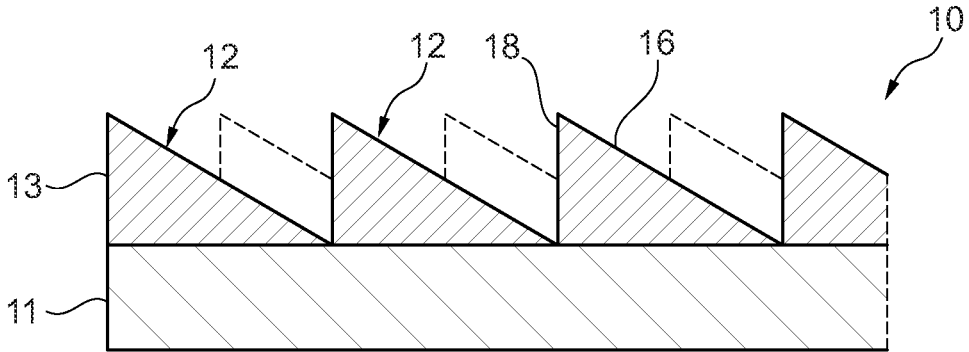
FIG. 2c shows a schematic cross-sectional view of layer sequences in step b) of the first embodiment.
Figure 2C:
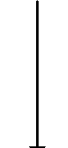
Figure 2C:
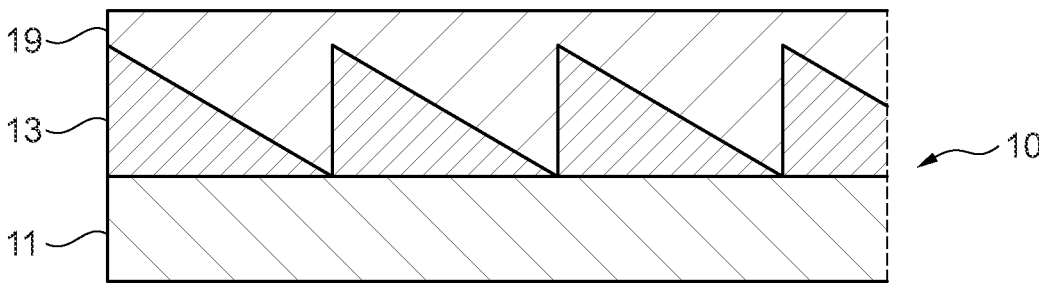

As shown in FIG. 2c with a schematic cross-sectional view of layer sequences, a pigment material layer 19 consisting of copper is applied in step b) of the method on the surface structure 10, i.e., on the embossing layer 13 having the surface regions 12, by a roll-to-roll process. In alternative examples a pigment material layer 19 may be applied that consists of a multilayer interference coating, optionally doubled interference coating. This corresponds to step S2 in the flow diagram of FIG. 5. The gradient of the surface regions 12 leads to a height offset between the surface regions 12 of a column. The arrangement of the surface regions 12 in columns 14 and 15 which are offset relative to one another leads to a height offset of the surface regions 12 between adjacent columns. In this way, predetermined breaking points for the production of the pigments are provided in the pigment material layer 19 applied on the surface structure.

In certain exemplary embodiments, the gradient m of the individual surface regions 12 is chosen such that the height offset is greater than the thickness of the pigments to be produced. Thus pigments of copper or aluminum may be only 50 nm thick, while a colorshift pigment may have a thickness, for example, of 1 μm. For example, for the production of platelet-shaped colorshift pigments intended to have lateral dimensions of around 30 μm, the gradient is chosen such that the pigment platelets formed on the surface structure 10 in the pigment material layer protrude preferably by at least 1 μm, in order to prevent the pigment platelets subsequently detached from the surface structure from cohering. There are also exemplary embodiments, however, in which the surface structure 10 corresponds to or is even somewhat less than the pigment material layer of pigment platelets formed.

In step c) of the method, the pigment material layer 19, consisting of copper, is released from the surface structure 10 by using water to dissolve the PVOH embossing varnish of the release layer. If the embossing varnish of the release layer consists of a water-insoluble thermoplastic, different solvents are used. On detachment, break-up at the predetermined breaking points of the pigment material layer produces a multiplicity of copper pigments having substantially the same square shape and having a narrow size distribution. This corresponds to step S3 in the flow diagram of FIG. 5. Where a multilayer interference coating is used as pigment material layer 19, interference pigments are produced.

In a second embodiment, a three-dimensional surface structure is produced likewise by an embossing method in step a) of the method, this corresponding to step S1 in the flow diagram of FIG. 5. For this purpose, a carrier foil of PET (polyethylene terephthalate) is provided as the substrate. An insoluble embossing layer 130 composed of water-insoluble hot stamping varnish PMMA (polymethyl methacrylate) is applied in a roll-to-roll process to the surface of the carrier foil. Alternative water-insoluble thermoplastic hot stamping varnishes are PVA (polyvinyl acetate) or PS (polystyrene). In the embossing layer 130, in analogy to the first example, using a roll-to-roll process, hot stamping produces a surface structure 100 having uniform surface regions 120, which each have a hexagonal planar surface 160 with the gradient m=0.5 and are arranged in columns 140 and 150 which are offset from one another. The offset between the columns 140, 150 results from the hexagonal contour of the surfaces 160.

Figure 3:
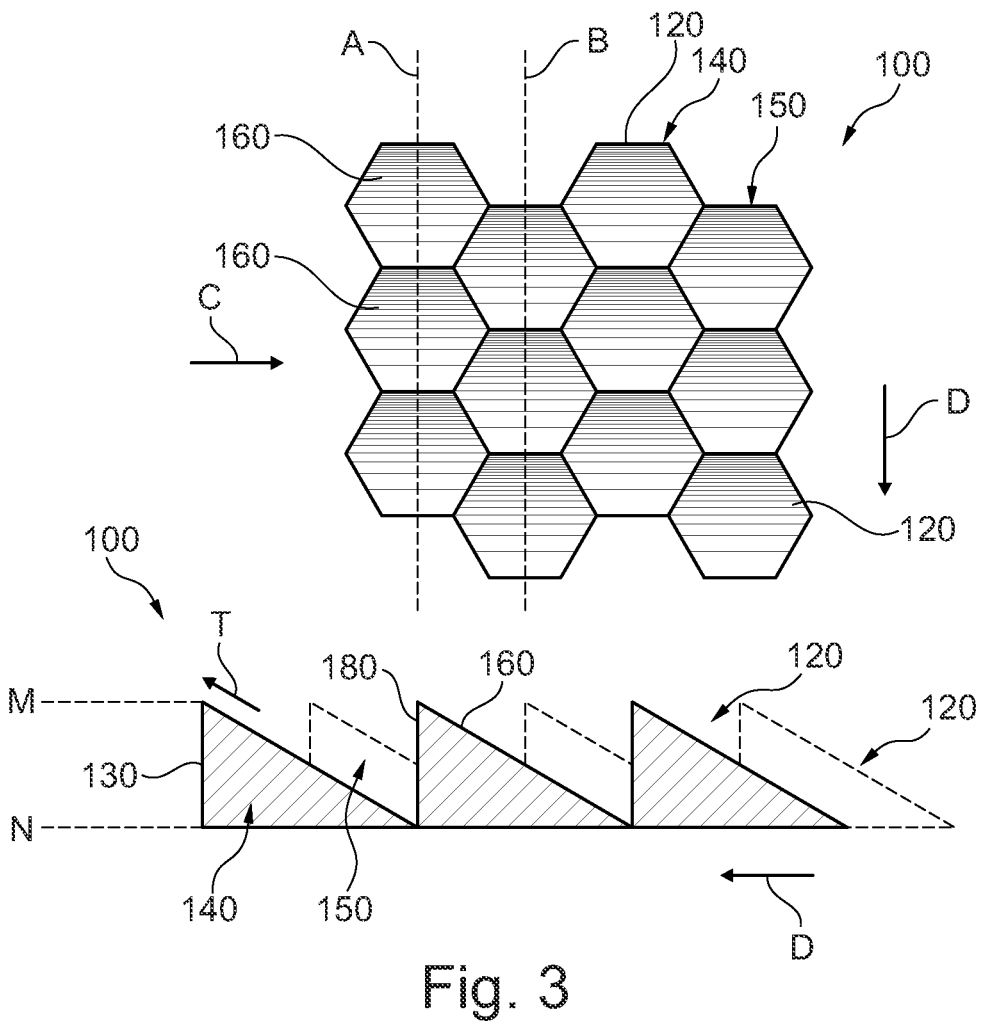
FIG. 3 shows schematically a surface structure of a second embodiment in plan view, and also a cross-sectional view through the surface structure.

FIG. 3 represents schematically the surface structure 100 produced in step a) of the second embodiment, and also a cross-sectional view along the plane A through one of the columns 140 of the surface structure 100. The cross section through the column 150 along the plane B is illustrated, in analogy to FIG. 2b, with a dashed line. In the present embodiment, the columns 140 and 150 each exhibit a sawtooth pattern in cross section. In the present example, the surface 160 extends with the slope m in each surface region 120 to the top level M, which is joined to the base level N of the surface region 120 following in the same column by a planar surface 180 perpendicular to the base level N. The height difference between successive surface regions 120 in a column 140, 150 is 10 μm, while the height difference between surface regions 120 of adjacent columns 140 and 150 is 5 μm.

A release layer (not shown) of water-soluble PVOH is printed in a roll-to-roll process onto the surface structure 100 produced in step a) of the second embodiment. The layer thickness of the release layer is chosen, in comparison to the height difference of the surface regions 120, so that it masks these regions and models the elevations and depressions of the surface structure 100. In other words, the release layer is configured as a layer conformant with the surface structure 100. The layer thickness of the release layer is typically smaller than the height offset of the surface structure 100, and may be applied preferably with a layer thickness of 50 nm to 2 μm. The release layer may be applied, for example, by means of gravure printing, flexographic printing, slot die or spray nozzle. In the present example a 500 nm PVOH layer is applied by means of gravure printing.

In step b) of the method, an aluminum pigment material layer (not shown) is applied to the release layer by a PVD method, this corresponding to step S2 in the flow diagram of FIG. 5. Because the gradient of the surface regions 120 and also the arrangement of the surface regions 120 into columns 140 and 150 which are offset relative to one another lead in each case to a height offset, predetermined breaking points for the later production of the pigments are provided in the pigment material layer applied on the release layer.

In step c) of the method, the aluminum pigment material layer is released from the surface structure 100 by dissolving the release layer with water. In this case, by break-up at the predetermined breaking points of the pigment material layer, a multiplicity of aluminum pigments are produced that have substantially the same hexagonal contour with a narrow size distribution, this corresponding to step S3 in the flow diagram of FIG. 5.

Figure 4:
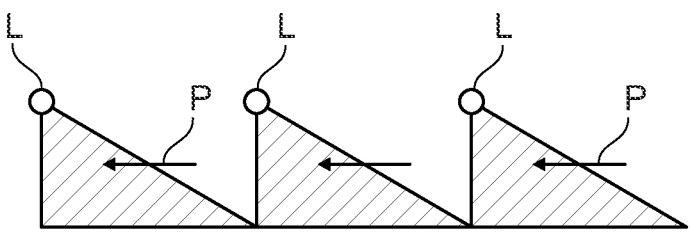
FIG. 4 shows schematically a cross-sectional view through a surface structure according to the first and second embodiments.

FIG. 4 shows schematically a general cross-sectional view through a surface structure 10, 100 in accordance with the first and second embodiments. Since surface regions 12, 120 are formed on the substrate by the method, these regions having at least partly a gradient that extends obliquely to a base level of the surface structure, plane-parallel surfaces of the surface structure are avoided. Any air bubbles L that are formed as a result of the embossing collect, as shown by FIG. 4, in the top region of the surface regions 12, 120 and/or in their bottom region. Surface defects resulting from this in the pigments produced with the surface structure are developed at the edges of the pigments and have little or no influence on their optical or functional properties. The arrows P illustrate a flow of material during embossing. During embossing, the material to be displaced need only be transported within one surface region, and the flow of material during embossing extends only in one direction. The amount of embossing material to be displaced is therefore small. This significantly facilitates the embossing operation from a technical standpoint, and the quality of the surface structure, and hence of the pigments produced in the further course of the method, goes up.

The invention claimed is:

1. A method for manufacturing pigments of defined size and shape, with the steps of:
   a) producing a three-dimensional surface structure on a substrate, where surface regions are formed which each have a gradient extending obliquely from a base level of the surface structure and a surface extending approximately perpendicular from the base level, and wherein successive surface regions repeat in a first direction along a surface of the substrate to form parallel columns which are offset relative to one another in a second direction along the surface of the substrate that is perpendicular to the first direction;
   b) applying a pigment material layer on the surface structure;
   c) separating the pigment material layer from the surface structure and producing pigments.

2. The method as claimed in claim 1,
   where the gradient of at least some of the surface regions is configured starting from the base level of the surface structure; and/or
   where the gradient of at least some of the surface regions in each case defines an identical gradient vector; and/or
   where the gradient of at least some of the surface regions is configured so as to extend to a top level of the surface structure and the respective top level of the surface regions is configured so as to be adjacent to the base level of a bordering surface region of the same column.

3. The method as claimed in claim 2, where the gradient vectors of at least some of the surface regions are arranged offset from one another and/or parallel to one another.

4. The method as claimed in claim 1, where at least some of the columns are arranged parallel to one another and/or are arranged in one direction and/or define a column vector.

5. The method as claimed in claim 4, where at least some of the surface regions are configured in such a way that the projection of the respective gradient vector onto the base level extends parallel to the column vector.

6. The method as claimed in claim 1, where at least some of the surface regions are configured each with an absolute height difference of 0.1 μm to 150 μm.

7. The method as claimed in claim 1, where for at least some of the surface regions, between adjacent surface regions of the same column, the average height difference is twice as great as the average height difference between surface regions of adjacent columns.

8. The method as claimed in claim 1, where at least some of the surface regions are configured with identical size and/or identical shape.

9. The method as claimed in claim 1, where at least some of the surface regions are configured, in plan view onto the surface structure, with a contour selected from a polygonal contour, a mutually complementary contour, and a free-form contour; and/or
   where at least some of the surface regions are provided with one or more marks.

10. The method as claimed in claim 1, where at least some of the surface regions of each column are configured as a sawtooth pattern in the cross section of the surface structure in the direction of the column vector.

11. The method as claimed in claim 1, where at least some of the columns are arranged offset from one another by half of a side length of a surface region.

12. The method as claimed in claim 1,
   where in step a) the three-dimensional surface structure is produced at least partly by an embossing method; and/or
   where in step a) the three-dimensional surface structure is produced by a method selected from:
   a1) an embossing method with the steps of: applying a soluble embossing layer as release layer to the substrate and performing a lithographic, more particularly photolithographic, operation, hot stamping or UV embossing; and/or
   a2) an embossing method with the steps of: providing a substrate deformable by hot stamping, or applying an insoluble embossing layer to the substrate, performing hot stamping or UV embossing; and applying a soluble, more particularly water-soluble, release layer.

13. The method as claimed in claim 1, where in step b) a pigment material layer comprising one or more inorganic materials and/or one or more organic materials is applied on the surface structure.

14. The method as claimed in claim 1, wherein the gradient extending obliquely from the base level of the surface structure of a first surface region of the surface regions terminates at the surface extending approximately perpendicular from the base level of a second surface region of the surface regions.

* * * * *